US009779785B2

(12) United States Patent
Li

(10) Patent No.: US 9,779,785 B2
(45) Date of Patent: Oct. 3, 2017

(54) COMPUTER ARCHITECTURE USING COMPUTE/STORAGE TILES

(71) Applicant: Wisconsin Alumni Research Foundation, Madison, WI (US)

(72) Inventor: Jing Li, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 27 days.

(21) Appl. No.: 14/709,017

(22) Filed: May 11, 2015

(65) Prior Publication Data

US 2016/0336050 A1    Nov. 17, 2016

(51) Int. Cl.
| | |
|---|---|
| *G11C 5/06* | (2006.01) |
| *G11C 7/10* | (2006.01) |
| *G06F 13/40* | (2006.01) |
| *G11C 5/02* | (2006.01) |
| *G11C 11/00* | (2006.01) |
| *G11C 13/00* | (2006.01) |
| *G11C 15/04* | (2006.01) |
| *G11C 7/18* | (2006.01) |
| *G11C 8/14* | (2006.01) |

(52) U.S. Cl.
CPC ............ *G11C 7/10* (2013.01); *G06F 13/4022* (2013.01); *G11C 5/025* (2013.01); *G11C 7/1006* (2013.01); *G11C 7/18* (2013.01); *G11C 8/14* (2013.01); *G11C 11/005* (2013.01); *G11C 13/0002* (2013.01); *G11C 13/0021* (2013.01); *G11C 15/046* (2013.01); *G11C 2207/005* (2013.01); *G11C 2213/77* (2013.01)

(58) Field of Classification Search
CPC .......... G11C 7/10; G11C 5/06; G06F 13/4022
See application file for complete search history.

(56) References Cited

U.S. PATENT DOCUMENTS

| | | | |
|---|---|---|---|
| 5,444,393 A * | 8/1995 | Yoshimori | ....... H03K 19/17704 326/38 |
| 5,473,267 A * | 12/1995 | Stansfield | .............. G11C 15/04 326/38 |
| 5,841,295 A | 11/1998 | Kaviani | |
| 5,909,125 A * | 6/1999 | Kean | ................ H03K 19/17728 326/39 |
| 5,910,732 A | 6/1999 | Trimberger | |
| 6,020,759 A | 2/2000 | Heile | |
| 6,037,800 A | 3/2000 | Trimberger | |
| 6,118,720 A | 9/2000 | Heile | |

(Continued)

OTHER PUBLICATIONS

Anthony Stansfield et al.; The Design of a New FPGA Architecture; Lecture Notes in Computer Science vol. 975, 1995, pp. 1-14, Oxford, UK.

(Continued)

*Primary Examiner* — Khamdan Alrobaie
(74) *Attorney, Agent, or Firm* — Boyle Fredrickson, S.C.

(57) ABSTRACT

A computer architecture employs multiple intercommunicating tiles each holding an array of memory elements. Programmable decoding circuitry allows these memory elements to be used as local memories (including content addressable memories or random access memories), logic elements or interconnect elements. The ability to dynamically change the function of any of these tiles allows tight integration of memory and logic tailored to particular calculation problems reducing costs in data transfer.

19 Claims, 4 Drawing Sheets

(56) References Cited

U.S. PATENT DOCUMENTS

| | | | |
|---|---|---|---|
| 6,144,573 | A | 11/2000 | Heile |
| 6,157,211 | A | 12/2000 | Kean |
| 6,160,419 | A | 12/2000 | Veenstra et al. |
| 6,212,670 | B1 | 4/2001 | Kaviani |
| 6,304,103 | B1 | 10/2001 | Kean |
| 6,326,807 | B1 | 12/2001 | Veenstra et al. |
| 6,344,989 | B1 | 2/2002 | Heile |
| 6,347,061 | B1 | 2/2002 | Heile |
| 6,453,382 | B1 | 9/2002 | Heile |
| 6,556,500 | B2 | 4/2003 | Heile |
| 7,111,110 | B1 | 9/2006 | Pederson |
| 7,145,361 | B1* | 12/2006 | Rohe .................. H01L 27/0207 257/E27.108 |
| 7,461,234 | B2 | 12/2008 | Ray et al. |
| 7,471,643 | B2 | 12/2008 | Stansfield |
| 7,480,763 | B2 | 1/2009 | Pedersen |
| 7,895,560 | B2 | 2/2011 | Lovell |
| 2007/0241772 | A1* | 10/2007 | Schmit ............. H03K 19/17728 326/38 |
| 2007/0285124 | A1* | 12/2007 | Schmit .................. G11O 5/025 326/41 |
| 2011/0029830 | A1* | 2/2011 | Miller .................. G06F 11/221 714/734 |

OTHER PUBLICATIONS

Michael Hutton et al; Interconnect Enhancements for a High-Speed PLD Architecture, Proceedings of the 2002 ACM/SIGDA tenth international symposium on Field-programmable gate arrays; pp. 3-10, 2002; New York, NY.

Alireza Kaviani et al.; Hybrid FPGA Architecture; FPGA '96 Proceedings of the 1996 ACM fourth international symposium on Field-programmable gate arrays, Feb. 1996, pp. 1-7; Monterey, CA.

Alireza Kaviani et al.; Technology Mapping Issues for an FPGA with Lookup Tables and PLA-like Blocks; FPGA '00 Proceedings of the 2000 ACM/SIGDA eighth international symposium on Field programmable gate arrays pp. 60-66: 2000; New York, NY.

Ray Bittner et al.; Wormhole Run-time Reconfiguration, Proceedings of the 1997 ACM fifth international symposium on Field-programmable gate arrays. ACM; pp. 79-85;1997; Monterey, CA.

Michael Hutton; Interconnect Prediction for Programmable Logic Devices; In Proceedings of the 2001 international workshop on System-level interconnect prediction, pp. 125-131. ACM, 2001. San Jose, CA.

Katherine Compton et al.; Reconfigurable Computing: A Survey of Systems and Software; ACM Computing Surveys (csuR) 34, No. 2 (2002): pp. 171-210; US.

Somnath Paul et al.; Reconfigurable Computing Using Content Addressable Memory for Improved Performance and Resource Usage; In Proceedings of the 45th annual Design Automation Conference, pp. 786-791. ACM, 2008. CA, USA.

Sunil KR. Singh et al.; Performance Evaluation of Hybrid Reconfigurable Computing Architecture over Symmetrical FPGA; International Journal of Embedded Systems and Applications (IJESA) vol. 2, No. 3, Sep. 2012; pp. 107-116; USA.

Carlos A. Zerbini et al.; Performance Evaluation of Packet Classification on FPGA-based TCAM Emulation Architectures; In Global Communications Conference (GLOBECOM), 2012 IEEE, pp. 2766-2771. IEEE, 2012. USA.

I. I. Bucur; Performance Mapping of K-Lut Based FPGAS; U.P.B. Sci. Bull., Series C, vol. 69, No. 2, 2007; pp. 49-60; USA.

Kenneth Yan; Practical Logic Synthesis for CPLDs and FPGAs with PLA-Style Logic Blocks; In Design Automation Conference, 2001. Proceedings of the ASP-DAC 2001. Asia and South Pacific, pp. 231-234. IEEE, 2001, CA, US.

Julio Faura et al.; FIPSOC: A Field Programmable System on a Chip; In Proc. XII Design of Circuits and Integrated Systems Conference. 1997; pp. 1-6; US.

Ian Page; "Reconfigurable processor architectures." Microprocessors and Microsystems 20, No. 3 (1996): 185-196. US.

Tony Stansfield; "Using multiplexers for control and data in D-Fabrix." In Field Programmable Logic and Application, pp. 415-425. Springer Berlin Heidelberg, 2003.

Srini Krishnamoorthy; "Technology mapping algorithms for hybrid FPGAs containing lookup tables and PLAs." Computer-Aided Design of Integrated Circuits and Systems, IEEE Transactions on 22, No. 5 (2003): 545-559. US.

Frank Heile et al.; Hybrid Product Term and LUT Based Architectures Using Embedded Memory Blocks; ACM 1999; FPGA 99; pp. 13-16; US.

Frank Heile et al.; Programmable Memory Blocks Supporting Content-Addressable Memory; ACM 2000; FPGA 2000; pp. 13-21; Monterey California.

Julio Faura et al.; A Novel Mixed Signal Programmable Device with On-Chip Microprocessor; IEEE 1997 Custom Integrated Circuits Conference; May 5-8, 1997; pp. 103-106; Santa Clara, California.

Srini Krishnamoorthy et al.; Area-Optimized Technology Mapping for Hybrid FPGAs; 10th International Conference, FPL 2000 Villach, Austria, Aug. 27-30, 2000 Proceedings, pp. 181-190; Austria.

Ernie Lin et al.; The Architecture of Dual-Mode FPGA Embedded System Blocks; Custom Integrated Circuits Conference, 2002. Proceedings of the IEEE 2002; pp. 67-70; Canada.

Rolf Enzler: Architectural Trade-offs in Dynamically Reconfigurable Processors; Series in Microelectronics; vol. 143; 2004; Entire Document 167 Pages; Walchwil ZG.

Kieran McLaughlin et al.; Exploring CAM Design for Network Processing Using FPGA Technology; Telecommunications, 2006, AICT-ICIW '06, International Conference on Internet and Web Applications and Services/Advanced International Conference on Feb. 19-25, 2006; 5 pages; US.

Gordon Brebner et al.; Field-Programmable Logic and Applications; 11th International Conference, FPL 2001 Proceedings; Entire Document 681 Pages; UK.

Daniel Simonelli; FIPBLOX: a graphical interactive design tool for FIPSOC; Conference Oct. 2003; pp. 1373-1383; Tandil, Argentina.

Alireza Kaviani et al; The Hybrid Field-Programmable Architecture; IEEE Design and Test of Computers, Apr.-Jun. 1999, pp. 74-83; Canada.

Gordon R. Chiu et al.; Mapping Arbitrary Logic Functions into Synchronous Embedded Memories for Area Reduction on FPGAs; ICCAD '06 Proceedings of the 2006 IEEE/ACM international conference on Computer-aided design; pp. 135-142; May 11, 2006; New York, NY.

Ion I. Bucur et al.; Optimal Area and Performance Mapping of K-Lut Based FPGAS; Journal of Information Systems & Operations Management 2.2, 2008; pp. 375-384.

Ernest Wei-Lang Lin; Product Term Mode Embedded Memory Arrays: Algorithms and Architectures; Thesis; Department of Electrical and Computer Engineering, pp. 1-98; Sep. 2001; Canada.

Kenneth Yan; Logic Synthesis for CPLDs and FPGAs with PLA-Style Logic Blocks: Dept. of Comput. Sci., California Univ., 2001; pp. 291-297; Los Angeles, CA, USA.

Ernie Lin et al.; Macrocell Architectures for Product Term Embedded Memory Arrays; Lecture Notes in Computer Science vol. 2147, 2001, pp. 48-58, Berlin Heidelberg.

* cited by examiner

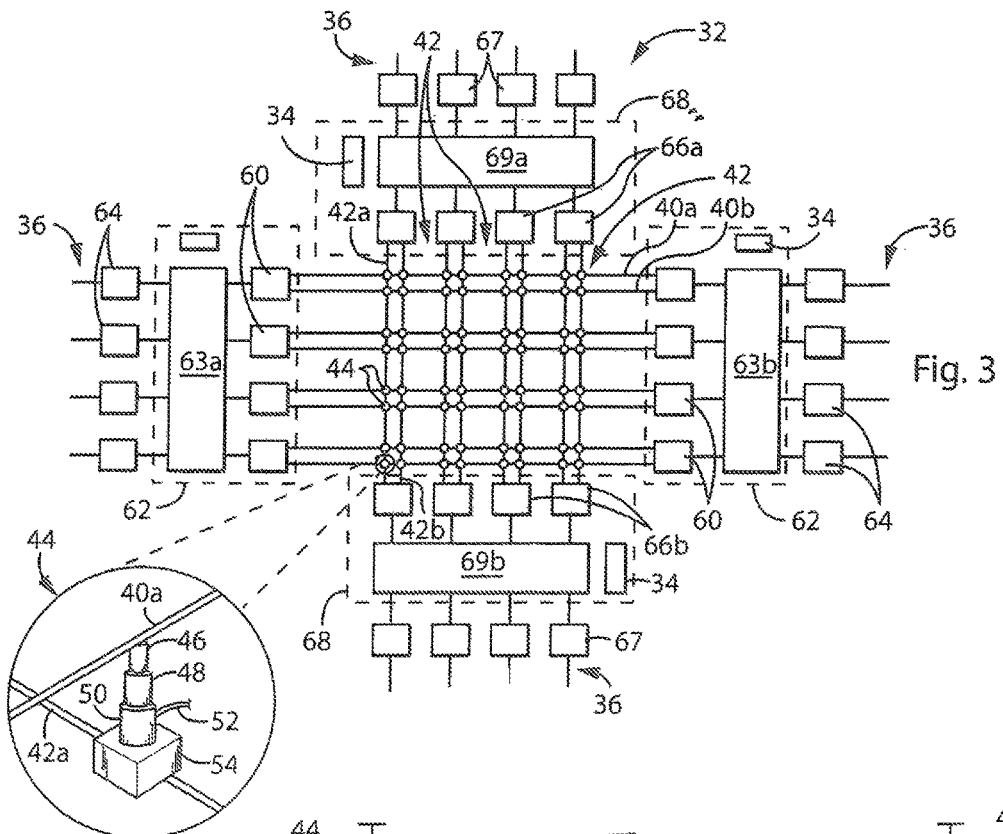
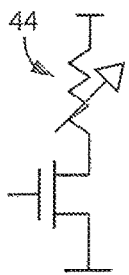
Fig. 4 (a)
Fig. 4 (b)
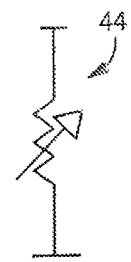
Fig. 4 (c)
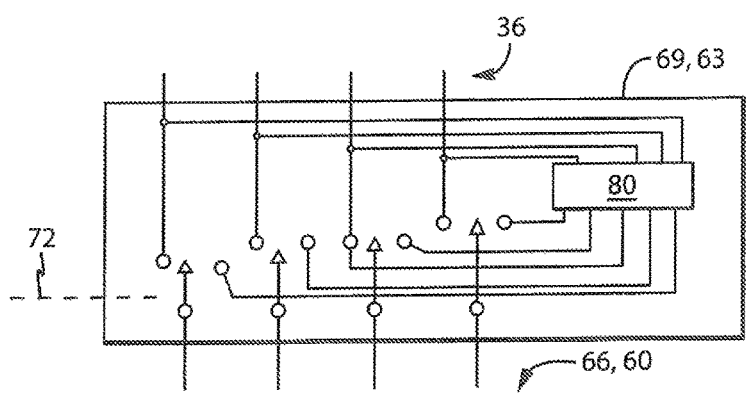
Fig. 6

COMPUTER ARCHITECTURE USING COMPUTE/STORAGE TILES

STATEMENT REGARDING FEDERALLY SPONSORED RESEARCH OR DEVELOPMENT

CROSS REFERENCE TO RELATED APPLICATION

BACKGROUND OF THE INVENTION

The present invention relates to computer architectures and in particular to a computer architecture that employs multiple interconnected tiles each providing a range of alternative computational or memory storage capabilities.

Common computer architectures employ intercommunication computational structures (e.g., processors) and storage structures (e.g., memory) that are highly compartmentalized. This compartmentalization permits the modularity of the hardware design, i.e., circuitry of each of the structures to be designed in different methodologies and manufactured in different types of foundries from different industries.

The drawback to this specialization and compartmentalization is the creation of data access bottlenecks between computational structures and storage structures that can greatly slow computation and waste of energy in transporting data between different structure locations.

For this reason, it is generally known to distribute memory elements among computational elements. For example, cache structures may be used in which small local memories are closely associated with each processor. These small local memories are preloaded with data that is expected to be used during processing to avoid the delays of obtaining the same data from a larger, more remote structure. Alternatively or in addition, distributed memory models may be used where each of multiple processors is associated with a different block of a main memory. This approach provides multiple paths between memory and processors avoiding the bottleneck of a single data channel for a very large memory.

Each of these techniques necessarily must anticipate the amount of memory that will be needed by a given process in making a distribution of the memory structures. To the extent that those assumptions about memory use are inaccurate or vary, after the distribution, wasteful excess memory can be allocated or time-consuming memory transfers from other locations can be required.

SUMMARY OF THE INVENTION

The present invention provides a fine-grained distribution of memory structures among processing structures through the use of inter-communicating tiles of processing and memory structures. Significantly, each tile can be dynamically reconfigured to provide either memory or computational abilities, allowing precise tailoring of memory to processors that can be adjusted for different executed processes.

In some embodiments the tiles provide multiple levels of computational ability and different types of memory structures providing increased flexibility to the integration between memory and computational structures. The tiles can also provide interconnection capabilities to facilitate close interaction between memory and computational structures in a date-flow manner without the need for separate interconnections switches.

Specifically then, in one embodiment, the invention provides a computational architecture using a set of interconnected tiles having input and output lines. Each tile has a set of addressable, memory elements and a set of interface circuits communicating between the input and output lines and the addressable memory elements. The interface circuits may programmably configure the nonvolatile memory elements as either: (1) a multi-bit memory; or (2) a logical gate array.

It is thus a feature of at least one embodiment of the invention to provide an architecture that allows memory and processing to be closely integrated on a program-by-program basis by providing tiles that can be changed between memory and logic functions.

The interface circuits may be configured so that the memory elements provide either: a random access memory in which multiple input bits on the input line provide an address for at least one memory element and the output lines provide the contents of the memory; or a content addressable memory where multiple input bits on the input lines provide a pattern to be matched in the contents of multiple memory elements and the output lines provide an indication of whether the pattern has been matched.

It is thus a feature of at least one embodiment of the invention to provide two different memory models for additional versatility.

The content addressable memory may be a ternary content addressable memory.

It is thus a feature of at least one embodiment of the invention to permit "don't care" states in the content addressable memory that can greatly compress the number of stored states necessary to address a range of inputs.

The interface circuits may be programmable to permit the memory elements to be configured as a logical gate where multiple input bits on the input lines provide an output bit on at least one output line being a Boolean combination of the multiple input bits.

It is thus a feature of at least one embodiment of the invention to provide a versatile logic element comparable to a configurable logic block in a programmable gate array.

The Boolean combination may be a sum of products of the multiple input bits.

It is thus a feature of at least one embodiment of the invention to provide a versatile "canonical form" gate system that can implement an arbitrary logical function.

The interface circuits may be further programmable to configure the memory elements as a crossbar switch in which multiple bits on the input lines are transferred to multiple bits on the output lines in a one-to-one mapping between input, lines and output lines.

It is thus a feature of at least one embodiment of the invention to permit the same tiles that provide memory and logic functions to provide interconnections between tiles.

Each interface circuits may be bi-directional, operating in a first mode to communicate signals from the memory elements and in a second mode to communicate signals to the memory elements.

It is thus a feature of at least one embodiment of the invention to greatly increase the interconnection options between tiles and minimize data transfer distances by permitting bi-directional data flow.

The interface circuits may include an input circuit decoding multi-bit input data on the input lines into a set of logical column conductors and an output circuit receiving and amplifying signals from a set of logical row conductors to provide multi-bit output data on the output lines. The memory elements may provide connections between one logical column conductor and one logical row conductor, whereby each logical column conductor may be interconnected to multiple logical row conductors;

It is thus a feature of at least one embodiment of the invention to provide a simple electrical structure that can be tiled in close-packed rows and columns.

The input interface circuits may be programmable to operate alternately to decode bits of the multi-bit data to corresponding logical row conductors by: (i) mapping different of multiple bits of the multi-bit input data to multiple different of multiple logical column conductors in a one-to-one mapping between bits of the multi-bit input data and logical column conductors; and (ii) mapping multiple bits of the multi-hit input data to a single logical column conductor according to a binary number expressed by the multi-bit input data.

It is thus a feature of at least one embodiment of the invention to provide interface circuits that can implement not only two types of memory (random access and content addressable) but also logic gates and crossbar switch functions, largely through reconfiguration.

Separate interface circuits may be associated with row lines and column lines and each separate interface circuit may include a first and second identical portion at either ends of column lines and at either end of row lines.

It is thus a feature of at least one embodiment of the invention to increase the versatility of the tiles by allowing data flow in from two different sides of the tiles for improved tile utilization and closer integration between tiles.

The interface circuits may be substantially identical for rows and columns.

It is thus a feature of at least one embodiment of the invention to provide for a highly versatile tile that can receive data flow from all sides and provide data output from all sides.

The interface circuits may include sense amplifiers providing a comparison of a received analog voltage against at least one threshold to provide a digital output.

It is thus a feature of at least one embodiment of the invention to provide a conversion of analog signal values from memory elements into digital values for accommodation of logic, storage, or interconnections using memory elements. The first portion of the output circuit may communicate with a first set of logical row conductors and the second portion may communicate with a different second set of logical row conductors.

It is thus a feature of at least one embodiment of the invention to increase the memory or logic capacity of the tile by the association of different rows with different data flow directions.

The memory elements may be any of a phase change memory (PCM), magnetoresistive random access memory (MRAM), spin transfer torque random access memory (STT RAM), resistive random access memory (RRAM), conductive bridge random access memory (CBRAM) and nanoelectromechanical (NEMS) memory.

It is thus a feature of at least one embodiment of the invention to provide a system that can work with a range of two-terminal type memory elements.

The tiles may be arranged in rows and columns, and tiles inside peripheral tiles may communicate with four adjacent tiles along rows and columns through interconnection of input lines or output lines.

It is thus a feature of at least one embodiment of the invention to provide a close intercommunication among tiles through at least vertical and horizontal interconnections.

The interface circuits communicating between the output lines and the addressable memory elements may include sense amplifiers for interpreting a signal on each logical row conductor as a discrete digital value including a logical one and logical zero or may interpret a signal on each logical row conductor as a discrete digital value having at least three states.

It is thus a feature of at least one embodiment of the invention to provide a system that can be used with binary and three-state logic, the latter possible with some types of memory elements.

Each interface circuits may be associated with a writable register receiving data defining a programmable configuration of the circuit in implementing a configuration of the memory elements.

It is thus a feature of at least one embodiment of the invention to provide an architecture that may be dynamically reconfigured according to the particular program being executed by writing to memory locations.

The computational architecture may provide architectural input and output lines conforming to an interface for a random access memory, for example, providing address and data lines.

It is thus a feature of at least one embodiment of the invention to provide a memory architecture that may use standard memory-type interfacing conventions to be readily integrated into current computer architecture super systems.

These particular objects and advantages may apply to only some embodiments falling within the claims and thus do not define the scope of the invention.

BRIEF DESCRIPTION OF THE DRAWINGS

FIG. 3 is a detailed block diagram of one tile of the architecture of FIG. 2 showing interface circuits communicating with logical rows and columns interconnected by memory elements;

FIGS. 4*a*-4*c* are depictions of memory elements in schematic various forms;

FIG. 6 is a block diagram showing a decoder showing multiple modes of operation;

DETAILED DESCRIPTION OF THE PREFERRED EMBODIMENT

Figure 1:
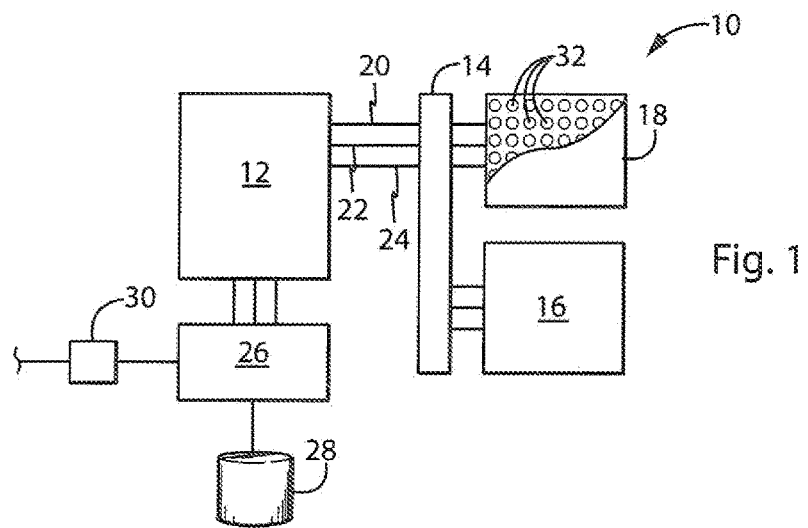
FIG. 1 is a simplified block diagram of a computer system employing the present computer architecture as a component of a computer system also employing a conventional computer processor.

Referring now to FIG. 1, a computer system 10 employing the present invention may provide one or more Von Neumann processors 12 communicating with a memory access bus 14. The memory access bus 14 may in turn communicate with random-access memory 16 and with a compute/storage system 18 of the present invention. The memory access bus 14 may provide for standard random-access configuration having address lines 20, data lines 22, and control lines 24 typically used for communication with random-access memory 16. The computer system 10 may also provide for an I/O bus 26 communicating with other peripherals including disk drive 28, network adapters 30, and the like.

The random-access memory 16 may hold programs consisting of program instructions read by the processors 12 and data operated on by the programs for reading and writing by the processor 12.

The compute/storage system 18 holds multiple tiles 32 that can be programmably reconfigured by internal registers 34 written to by the processors 12. For example, a program in the random-access memory 16 may cause the processors 12 to write configuration values to the internal registers 34 of the tiles 32 in the manner of a conventional random-access memory. For this purpose, the internal registers 34 may have addresses mapped to low order addresses of the address lines 20.

As will be discussed in more detail below, this programmable reconfiguration through the registers 34 can both change the interconnection among the tiles 32 and the function of the tiles 32 among functions of: storage, computation, and interconnection. As so configured, the tiles 32 may operate on data provided by the processor 12 or stored in other tiles 32 and may write data back to the processor 12 or to other tiles 32.

Figure 2:
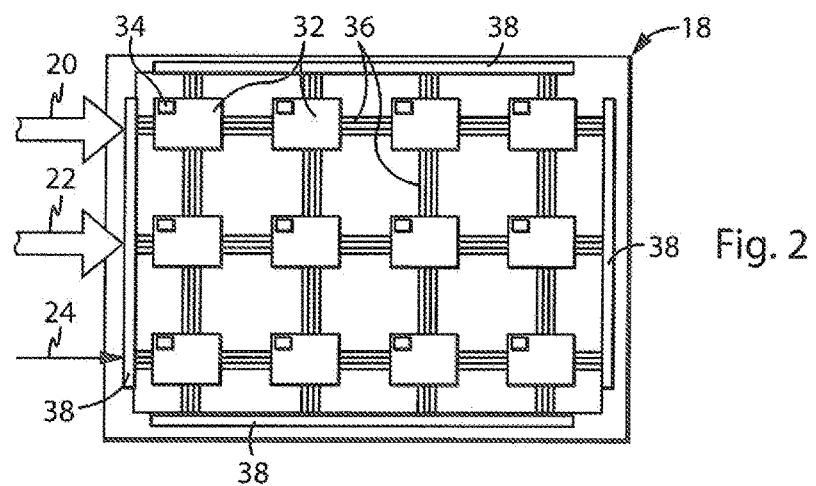
FIG. 2 is an expanded block diagram of a computer architecture of the present invention showing multiple identical tiles intercommunicating in a network and communicating with a conventional computer processor using a standard DRAM-type interface.

Referring now to FIG. 2, in one embodiment, the tiles 32 may be generally rectangular having four sides and arranged in rectilinear rows and columns. Interconnecting communication lines 36 extending from each side of each tile 32 may join with other tiles 32 or with input/output circuitry 38 for the compute/storage system 18. In a simple example, each tile 32 may provide four logic level communication lines 36 on each side of the tile 32. Interior tiles 32, that is those surrounded on each of four sides by other tiles 32, may join their communication lines 36 to the corresponding communication lines of corresponding faces of adjacent tiles 32. Peripheral tiles 32, that is those surrounded on only three of four sides by other tiles 32, may join their communication lines 36 to the corresponding communication lines of corresponding faces of adjacent tiles 32 and may have a communication line 36 on the remaining face connected to input/output circuitry 38 mapped to the data lines 22 to be written to or read from according to the addresses on address lines 20. Control lines 24 provide for circuit select signals and timing for the read and write operations as is generally understood in the art of memory interface protocols.

Tile Overview

Referring now to FIG. 3, each tile 32 may hold multiple pairs of logical row conductors 40 and multiple pairs of crossing logical column conductors 42. In the example shown, four logical row conductors 40 (each comprised of upper row conductor 40a and lower row conductor 40b) and four logical column conductors 42 (each comprised of left column conductor 42a and right column conductor 42b) are provided.

In this example, there will be sixty-four crossing points where the conductors of the rows and columns cross and where the conductors of the rows and columns are interconnected through a nonvolatile memory element 44. The nonvolatile memory elements 44 may be any "two terminal" memory devices where the passage of electrical current between the two terminals reveals a stored memory state of the memory element 44. The memory elements 44 may contain only storage elements 46 or storage elements 46 integrated with diodes or transistors at the $3^{rd}$ dimension. Example such memory elements 44 include, but are not limited to, phase change memory (PCM), magnetoresistive random access memory (MUM), spin transfer torque random access memory (STT RAM), resistive random access memory (RRAM), conductive bridge random access memory (CBRAM) and nanoelectromechanical (NEMS) memory.

In one example, shown in FIG. 3 as an inset, the nonvolatile memory elements 44 may include a storage node 46, for example, connected on one side to an upper row conductor 40a and connected on the other side to a drain 48 of a MOS transistor. The drain 48 is positioned on one side of a gate 50 of the MOS transistor which may receive a voltage input signal on a conductor 52. A source 54 of the MOS transistor may be connected to a left column conductor 42a.

A schematic representation of this particular memory element 44 is shown in FIG. 4a where the variable resistor symbol represents the storage node 46, for example, a phase change material that changes resistance as a function of memory state, and the transistor symbol represents the drain gate source structure of drain 48, gate 50 and source 54. Alternatively the memory elements 44 may provide for a variable resistive element or its equivalent followed by a diode structure as shown in FIG. 4b or solely a variable resistance symbol without any access devices as shown in FIG. 4c.

Referring again to FIG. 3, under a preferred logic convention, the lines to the bi-directional sense amplifier 60 are placed in a logical TRUE state when they are pulled to a low voltage (for example, as otherwise maintained high by a pull up resistor) by a low resistance of the memory element 44 (also considered to be a TRUE state of the memory element 44) upon an application of a TRUE state on corresponding column conductor 42 expressed as a low voltage on corresponding conductor 42. It will be appreciated that other logical conventions may equally be used with appropriate adjustments.

Referring again to FIG. 3, the upper row conductors 40a of each pair may be received by a corresponding bi-directional complementary sense amplifier 60a on the right side of the tile 32. The lower row conductors 40b of each pair are received by corresponding bi-directional complementary sense amplifiers 60b on a left side of the tile 32.

Each bi-directional complementary sense amplifier 60a or 60b communicates in turn with corresponding decoder logic 63 ((53a or 63b) which in turn communicates with specialized bi-directional clocking circuits 64a or 64b equal in number to the number of bi-directional complementary sense amplifiers 60. These bi-directional clocking circuits 64 in turn communicate corresponding communication lines 36. Specifically, bi-directional clocking circuits 64a communicate with the communication lines 36 on the right side of the tile 32 and bi-directional clocking circuits 64b communicate with the communication lines 36 on the left side of the tile 32. It will be understood that the number of communication lines 36 on each side of a tile 32 can be less than the number of corresponding column conductors 42 or row conductors 40 respectively for example by sending the data out in burst mode multiplexed onto a lesser number of communication lines 36.

Each of the left column conductors 42a and right column conductors 42b communicate at their upper and lower ends with interface circuits 68a and 68b, respectively. The interface circuits 68a and 68b include bi-directional decoder logic 69a and 69b, respectively, communicating between bi-directional complementary sense amplifiers 66a and clocking circuits 67 on the upper end and between bi-directional complementary sense amplifiers 66b and clocking circuits 67 on the lower end of each column conductor 42. As will be discussed below, each complementary sense amplifier 66 receives a corresponding single logic level conductor from corresponding decoder logic 69a (for the upper complementary sense amplifier 66a) and decoder logic 69b (for the lower complementary sense amplifier 66b), the latter of which provide corresponding connections to clocking circuits 67 connecting to communication lines 36 for the upper and lower portion of the tile 32.

Figure 5:
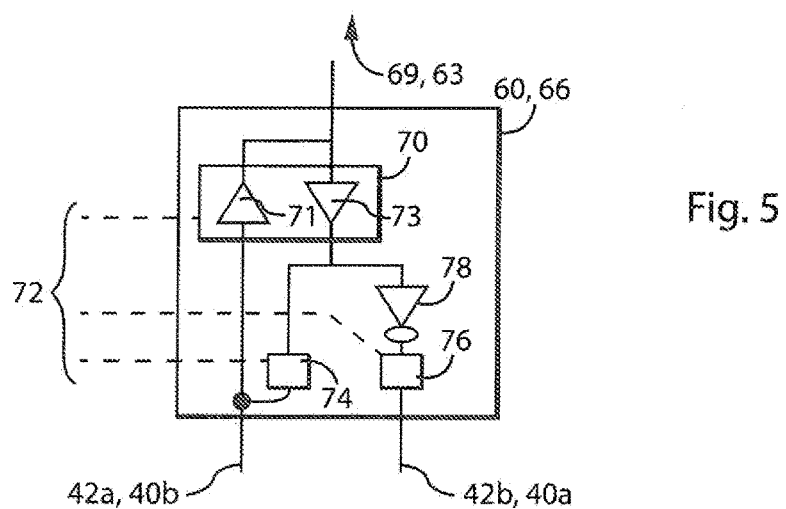
FIG. 5 is a block diagram showing a bi-directional amplifier providing multiple modes of operation.

Referring now to FIG. 5, each of the bi-directional outputs of complementary sense amplifiers 60 and 66 may hold a bi-directional buffer amplifier 70 controlled by a control line 72 set by a register value in register 34. The bi-directional buffer amplifier 70 includes a sense amplifier 71 which compares an analog input against one or more threshold values to provide a digital output and a conventional digital buffer amplifier 73 having a fixed logic level threshold. These control lines 72 determine the direction of data flow through the complementary sense amplifier 60 and 66 either, in a first forward state, from the interface circuits 63 and 69 to the logical row conductors 40 and the logical column conductors 42 or, in a second reverse state, from the logical row conductors 40 and the logical column conductors 42 to the interface circuits 63 and 69. In the first state, data flows from the complementary sense amplifier 60 and 66 in parallel along two paths, the first path to a first transmission gate 74 (acting like a solid-state digital switch) whose output may connect to upper row conductor 40a and left column conductor 42a. The second path leads to an inverter 78 and then to a second transmission gate 76 connected to lower row conductor 40b and right column conductor 42b. Only one of the transmission gates 74 and 76 is active at any given time. The activation of gates 74 and 76 may be according to bits set in the registers 34 so that they may be independently controlled as will be discussed below.

In the second state of the complementary sense amplifier 60 and 66, data flows backward from upper row conductor 40a and left column conductor 42a to the sense amplifier 71 of the bi-directional buffer amplifier 70 and then to decoder logic 63 or 69 respectively.

Referring now to FIG. 6, the decoder logic 63 and 69 may operate in two states as set by the values in the register 34. In a first "pass-through" state, four communication lines 36 connect directly to corresponding complementary sense amplifier 60 and 66. In this state, the poles of the depicted switches (implemented in solid-state electronics) communicate with the leftward throws. This state allows dataflow bi-directionally.

In a second "address extraction" state, data from the communication lines 36 is decoded by a 4-to-1 decoder 80 which interprets the data on the communication lines 36 as a number in binary between zero and four (looking at only two of the communication lines 36) to assert a TRUE value on a single one of the complementary sense amplifiers 60 and 66 determined by that decoded number. For example, if the decoded number is zero, the uppermost complementary sense amplifier 60 and leftmost complementary sense amplifier 66 will receive the TRUE value. If the decoded number is one, the second from the uppermost complementary sense amplifier 60 and the leftmost complementary sense amplifier 66 receives the TRUE value. If the decoded number is two, the third from the uppermost complementary sense amplifier 60 and the leftmost complementary sense amplifier 66 receives a TRUE value, etc.

As will be discussed further below, the decoder 80 may in general operate as an N to M decoder, for example, to provide for 4-to-2 decoding discussed below with respect to memory operations.

Tile Configurations

Figure 12:
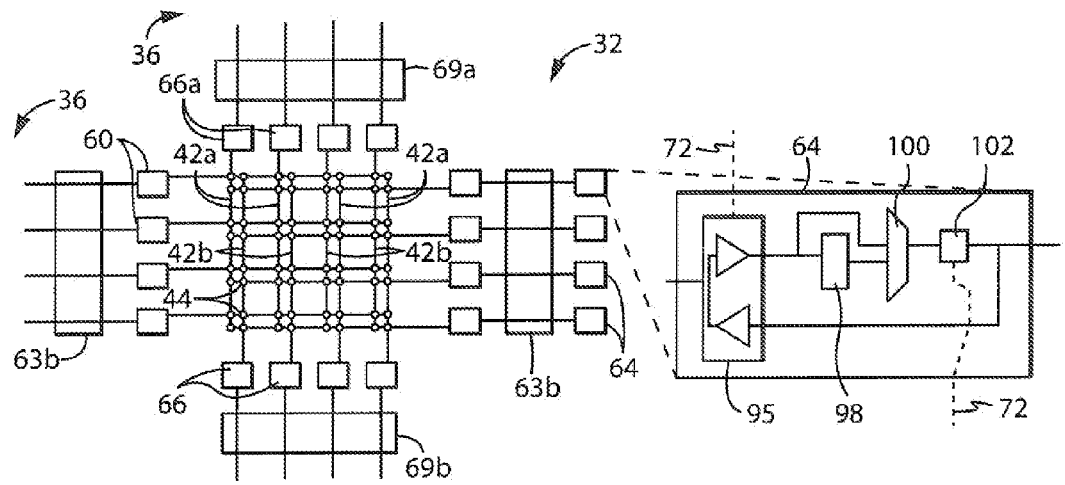
FIG. 12 is a figure similar to that of FIGS. 7, 8 and 10 showing configuration of the tile as a crossbar switch.

The tile 32 may operate in at least four different modes that will be described with respect to FIG. 7, FIG. 8, FIG. 10, and FIG. 12. Those modes respectively allow the tile 32 to act like a random-access memory (FIG. 7), a content addressable memory (FIG. 8), a computational element (FIG. 10) or an interconnect or crossbar switch (FIG. 12). For clarity, the configurations will be depicted as a connecting and disconnecting of column conductors 42 and row conductors 40 from the corresponding complementary sense amplifiers 60 and 66, with an understanding that the actual connection processes is internal to the complementary sense amplifier 60 and 66. A "bubble" has been added to the symbol of the complementary sense amplifier 60 and 66 to indicate the location of inverter 78 (shown in FIG. 5).

I. Random-Access Memory

Figure 7:
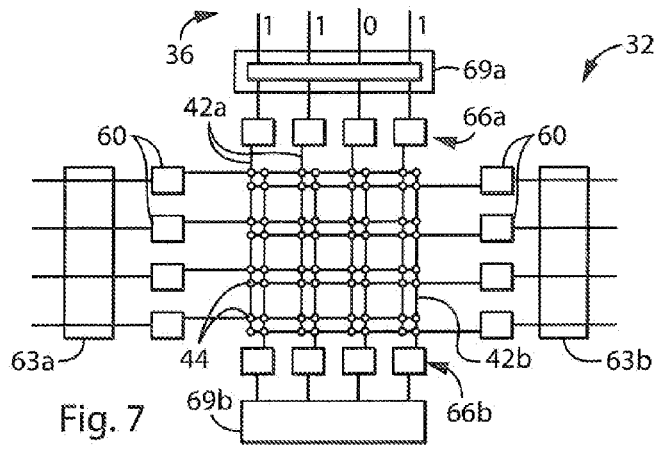
FIG. 7 is a figure similar to that of FIG. 3 showing configuration of a tile for random access memory function.

Referring now to FIG. 7, in the memory mode operation, address data is received by either the decoder logic 69a or 69b and the decoder logic 63a or 63b. An example where word address data is received first by the decoder, logic 69a will be depicted. The decoder logic 69a operates in the "address extraction" state to decode the received data from communication lines 36 (via clocking circuits 67) to lower a single one of its outputs to a TRUE state to one complementary sense amplifier 66b. In this example, the received number decodes to providing a logical TRUE state to the third complementary sense amplifier 66 from the left according to a negative logic convention that simplifies operation of the present circuit.

The complementary sense amplifier 66 in this case operates in a forward data mode with the transmission gates set so that only left column conductor 42a is activated. This left column conductor 42a is dropped to a TRUE state along the entire column and the selected memory elements 44 from this column in a low resistance (TRUE) will draw a corresponding current (and create a voltage drop) at a bi-directional complementary sense amplifier 60 associated with the row conductor 40 of that low resistance memory element 44 indicating the contents of that memory element 44 in the manner of a random-access memory. In this mode, decoder logic 63a or 63b could operate simply in a "pass-through" mode to output the selected data, but preferably instead operates in the "address extraction" state to decode the rest of address bits received from communication lines 36 (via clocking circuits 64) and further select a subset of the data of the selected column. This is of particular value when the number of bits in each column is large and also when the number of communication lines 36 is limited as discussed above with respect to burst mode multiplexing. In this latter approach, for example, the decoder 80 of decoder logic 63a may operate as a 4-to-2 decoder to receive the remaining address bits to only select data from the rightmost two columns. In general, if each column provides data of a multibyte word, the data selected may be a single byte from the multibyte word contained in a given column. Data values from the outputs of the memory elements 42 received by associated bi-directional complementary sense amplifier 60 will then pass to the corresponding communication lines 36 via the output clocking circuits 64 which optionally synchronize these signals to a clock signal as will be discussed further below.

Note that the same data or different data can be output to the bi-directional complementary sense amplifier 60 on either the right or the left side depending on the storage of data in the memory elements 44. The earlier storage of data in those memory elements 44 may be handled by datawriting circuitry that will be unique to the particular type of memory elements 44 as is understood in the art and which is not depicted for clarity.

It will be appreciated that thirty-two bits of data stored by memory elements 44 can be accessed through the upper decoder logic 69 and an additional thirty-two bits of data stored by memory elements 44 may be accessed through the lower decoder logic 69b if the read operations are synchronized and do not overlap.

The configuration of the tile 32 as a memory element allows data to be stored locally to other tiles 32 for use by those tiles 32 without the need to communicate outside of the compute/storage system 18.

II. Ternary Content Addressable Memory

Figures 8, 9:
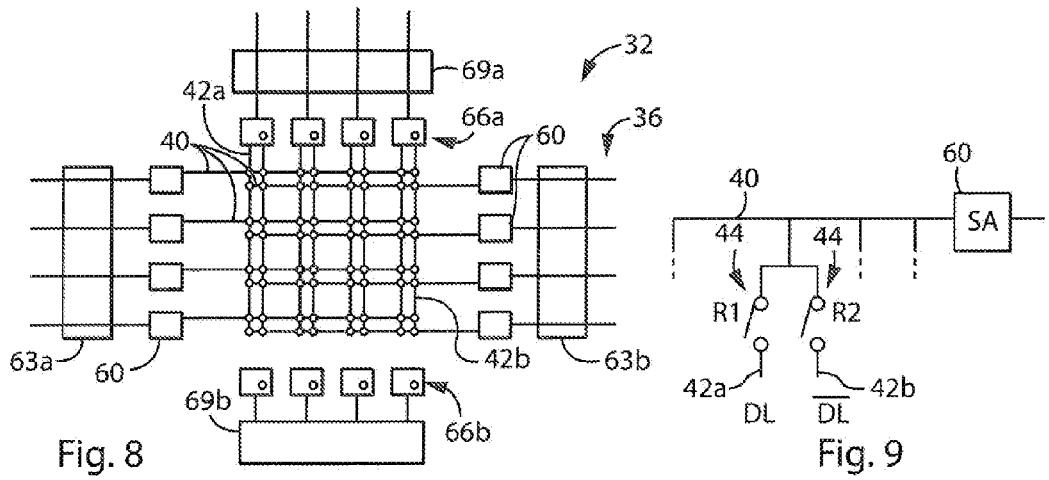
FIG. 8 is a figure similar to that of FIG. 7 showing configuration of a tile for a TCAM function.
FIG. 9 is a simplified schematic showing the principles of search operation of the TCAM of FIG. 8.

Referring now to FIG. 8, alternatively the tile 32 may be reconfigured as a content addressable memory and in particular as a ternary content addressable memory (TCAM). In this configuration, only one set of complementary sense amplifiers 66 (66a in this example) is connected to the column conductors 42 (left and right) and the other set of complementary sense amplifiers (66b in this example) is disconnected by setting the transmission gates appropriately.

The leftmost column conductor 42a of each pair is connected to the non-inverting output of complementary sense amplifier 66 and rightmost column conductor 42b is connected to the inverting output of complementary sense amplifier 66. The decoder logic 69 operates in the "passthrough" mode to receive a data value that is then reflected onto the column conductors 42 without other translation.

Here the bi-directional complementary sense amplifier 60 operate simply to discriminate between voltage levels and to output a logical value to the decoder logic 63 operating in a pass-through mode directly to the communication lines 36.

The outputs of the complementary sense amplifier 66 are then communicated to the left and right bi-directional complementary sense amplifiers 60 through memory elements 44. In this case, because both left column conductor 42a and right column conductor 42b are activated by each complementary sense amplifier 66 according to its received bits (in the negative logic), the output along a row conductor 40 will indicate a Boolean combination of the current flows through each memory element 44 for that row reflected in the state of the voltage of the row conductor 40 sensed by a sense amplifier 60. Put another way, this configuration implements a "wired AND" connection meaning that the output line to the bi-directional sense amplifier 60 will remain high only so long as the memory elements 44 for any column conductor 42 in a low state has a high resistance.

Referring now to FIG. 9, for example, memory elements 44 for a given left column conductor 42a may be designated R1 and the signal on the left column conductor 42a designated DL. Conversely, the memory elements 44 for the corresponding right column conductor 42b may be designated R2 and the signal on the right column conductor 42b designated $\overline{DL}$ (that is the logical inverse of DL). In this way, two memory elements 44 associated with a pair of column conductors 42a and 42b and a given row conductor 40 can express three states of a "match", "no match", or "don't care" state necessary for TCAM implementation according to the following Table I in which R indicates a large resistance of the memory elements 44 indicating a "1" memory state and r indicates a low resistance of the memory element 44 indicating a "0" memory state:

TABLE I

| R1 | R2 | $\overline{DL}$ | DL | State |
|---|---|---|---|---|
| R | R | HIGH/LOW | LOW/HIGH | Don't care |
| r | R | LOW | HIGH | No match |
| r | R | HIGH | LOW | Match 0 |
| R | r | HIGH | LOW | No match |
| R | r | LOW | HIGH | Match 1 |

The conditions of "don't care", "no match", and "match" relate to a comparison of the data received at the communication lines 36 by decoder logic 69 and the data stored in the memory elements 44. It will be appreciated that the TCAM can implement a matching that detects whether a given memory entry or word implemented by a single upper row conductor 40a or lower row conductor 40b exactly matches the data input at the decoder logic 69a for memory elements 44 that designate a one or zero value while ignoring (assuming a match) memory elements 44 that designate a "don't care" state. A match requires the logical ANDing of the states for each column pair of conductor 42a and 42b produced by the wired AND configuration discussed above.

A data value input at the decoder logic 69a can be applied to the TCAM memory which immediately detects whether there is a match with any stored words (each word formed by a row conductor 40 and it's associated memory elements 44) such as produces a high output at a corresponding sense amplifier for the row of that storage.

III. Logic Computation

Figures 10, 11:
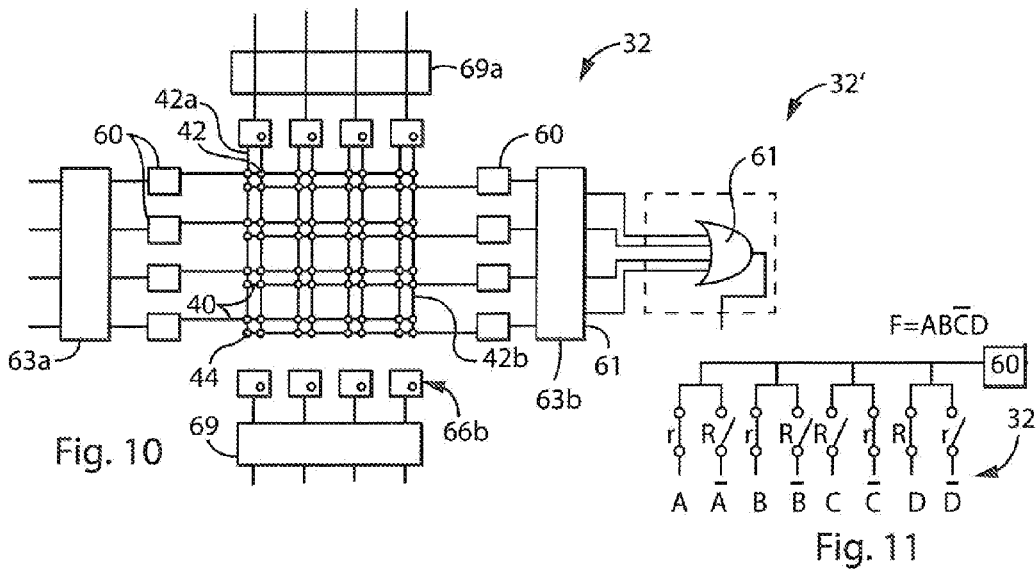
FIG. 10 is a figure similar to that of FIGS. 7 and 8 showing configuration of the tile as a logical gate element.
FIG. 11 is a simplified schematic showing the principles of forming a logical gate element in the configuration of FIG. 10.

Referring now to FIG. 10, the tile 32 may provide for basic computations implementing a logical combination of Boolean elements, for example, in a sum of products gate array. Here again, either one or the other of the decoders 69 or 63 or may be activated to receive data and in this example it is assumed that decoder 69a is activated and decoder 69b deactivated by the opening of the appropriate transmission gates 74 on their complementary sense amplifiers 66.

As discussed in the previous example, complementary sense amplifier 66a will simultaneously drive the left column conductor 42a and the right column conductor 42b in complementary fashion. The decoder logic 69a operates in the pass-through mode.

The outputs of the bi-directional sense amplifier 60 are combined by the decoder logic 63 and sent to an adjacent tile 32', which operates to combine those outputs in a logical OR 61 to implement the sum-of-product logic. It will be appreciated that this adjacent tile 32' can be readily configured to implement a logical OR simply by providing logical connections from each row conductor to a single column conductor designated as the OR output.

Referring also to FIG. 11, it will be understood that each logical row conductor 40 provides a logical value that equals a logical ANDing of the values expressed by each of the complementary sense amplifiers 66a as moderated by the respective memory elements 44. By adjusting the memory elements 44 to have one high resistance R and one low resistance r memory element 44 for each left column conductor 42a and right column conductor 42b, a changing of the particular left or right column conductor 42 that has a high resistance R can control whether the particular input to a column conductor pair is inverted or not. For example, consider the logical value A received by leftmost complementary sense amplifier 66. The left column conductor 42a of the first logical row will express the value of A and the right column conductor 42b of this row will express the logical value of $\overline{A}$. By selecting the values of resistance of the memory elements 44 connecting the column conductors 42a and 42b to the corresponding row conductor 40, only one of A or $\overline{A}$ will affect the voltage on the row conductor 40 received by the corresponding bi-directional sense amplifier 60. So, for example, if for the rows A, B, and D a low resistance memory element r connects the left column conductor 42a to the row conductor 40 and a high resistance element R connects the right column conductor 42b to the row conductor 40, while for the column C the reverse is true with a high resistance memory R connecting the left column conductor 42a to the row conductor 40 and a low resistance memory element r connecting the right column conductor 42b to the row conductor 40, the sense amplifier 60 will determine a value $F=AB\overline{C}D$. By similar operation any logical product calculation of up to four bits can be performed simply by setting the values of the memory elements 44.

As noted, an adjacent tile 32' will combine the outputs from conductor 36 of the current tile 32 to create a sum of products F+G+H+I where each of the terms G, H, and I, like F, described above is a unique product of A, B, C, and D. Generally, therefore it will be appreciated that in this configuration, tile 32 with its adjacent tile 32 may implement an arbitrary four input logical function. Further it will be appreciated that this form can implement "don't care" states, for example, F=ABC, simply by setting both of the memory elements 44 for a given column conductor to a high resistance value. As a result, this logical form is far more efficient than implementing a logical function than a truth table in memory and may be distinguished from such an implementation.

IV. Crossbar Switch

Referring now to FIG. 12, the tile 32 may also operate as a crossbar switch to provide interconnection of data between other tiles 32. In this implementation, the decoder logic 69 and 63 may operate in pass-through mode taking advantage of bi-directionality as appropriate for the various configurations of FIG. 13. Each of the complementary sense amplifiers 66, as in the ease for the random-access memory above, connects to only one of each pair of column conductors 42, for example, with complementary sense amplifier 66a connecting to only left column conductors 42a and complementary sense amplifier 66b connecting only to right column conductors 42b. The operation of a crossbar switch is simply implemented by joining column conductors and row conductors with low resistance memory elements 44.

In this case, the output interface circuit 64 will provide for dual directional operation through a bi-directional buffer 95 similar to bi-directional buffer amplifier 70 whose output connects through a standard synchronizing circuit to provide either an output that is synchronized by a D-latch 98 by a clock signal (not shown clocking the D-latch) or, as selected by a multiplexer 100, to bypass the latch 98 to provide an asynchronous output. A transition gate 102 on the output of the multiplexer 100 allows disconnection of the multiplexer 100 at times when a reverse direction of transmission is required.

Figure 13:
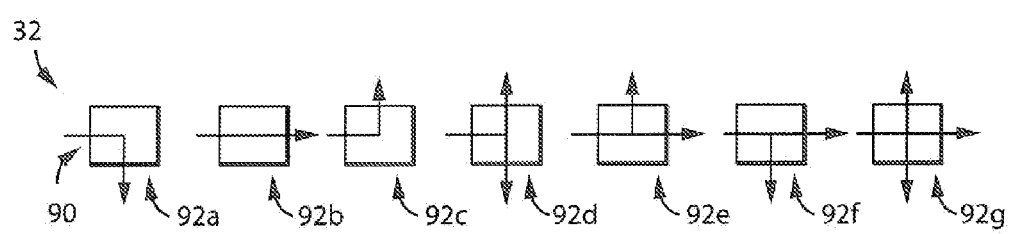
FIG. 13 is a set of dataflow diagrams showing different possible configurations of dataflow for a given face of the tile of the crossbar switch of FIG. 12.

Referring momentarily to FIG. 13, using this crossbar configuration, data received at any face 90 of the tile 32, for example a left face, may be conveyed with a one-to-one mapping between communication lines 36 to an output to the lower face as indicated by configuration 92a, the opposite face as indicated by configuration 92b, the upper face indicated by configuration 92c, the upper and lower faces as indicated by configuration 92d, the upper and opposite faces as indicated by configuration 92e, the lower and opposite faces as indicated by configuration 92f and the opposite, upper and lower faces as indicated by configuration 92g. This provides great flexibility in routing signals among the tiles 32.

Figure 14:
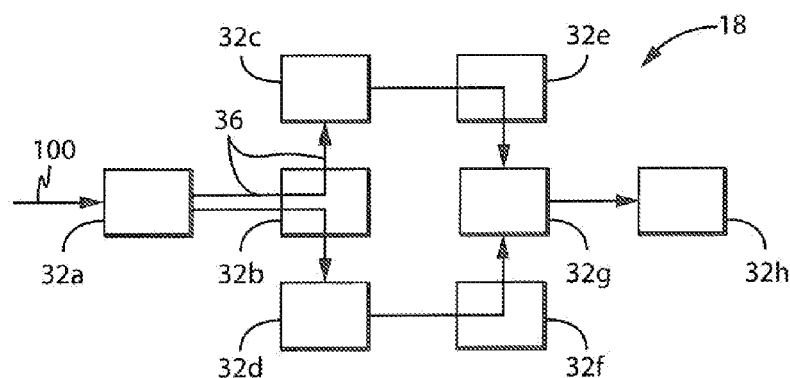
FIG. 14 is an example of a configuration of the tiles to perform a simple calculation.

Referring now to FIG. 14, a simple example of the use of the compute/storage system 18 of the present invention may calculate the total number of matches of a first value R1 with an array A stored in a TCAM (implemented by tiles 32c and 32d) and then provide a sum (calculated by tile 32g) equal to the number of matches.

The value R1 may be obtained from a first tile 32a receiving an address value 104 (MEM [addr1]), for example, from an external processor 12 (shown in FIG. 1). The value of R1 expressed as four bits on corresponding communication lines 36 may be routed by tile 32b acting as a crossbar switch to TCAMS implemented by tiles 32c and 32d holding the values of the array A as previously stored. The outputs from these TCAM of tiles 32c and 32d may be routed by tiles 32e and 32f operating as crossbar switches to a tile 32d implementing an adder using logical gates as described above. The output may be stored in tile 32h acting again as a memory which may be accessed by the external processor or used for a later processing step performed by other tiles 32.

It will be appreciated that the symmetry of the tiles 32 in terms of their circuitry allows data to be input into the tiles 32 in any of the directions of up, down, left, or right and the output in any of these directions. At a given data flow "cycle", data will be processed as it moves from rows to columns or columns to rows. However, it will be appreciated that over successive data flow cycles, data may flow into a row, for example and then out of a row in the same or opposite directions.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to a processor can be understood to include one or more processors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

I claim:

1. A computational architecture comprising:
a set of tile circuits positioned at intersections of external row and column conductors communicating between the tile circuits, each tile circuit providing:
interface circuits connecting external row and column conductors to corresponding crossing internal row and column conductors;
a set of memory elements for storing at least a first and second memory state and positioned between the crossing of internal row and column conductors to provide an electrical connection between given rows and columns of the internal row and column conductors through the memory elements depending on a state of the given memory element; and
wherein the interface circuits and the memory elements may programmably configure each tile alternatively as each of:
(1) a logic element receiving input signals on some of the external row or column conductors to provide output signals on other of the external row or column conductors the output signals being a logical function of the input signals different from the input signals, the logical function determined at least in part by electrical connections between the internal row and column conductors corresponding to the external row and column conductors through the memory elements; and
(2) an interconnection element passing input signals on external row or column conductors to provide output signals identical to the input signals on at least two conductors of either of the external row and column conductors, the selected external row and column determined at least in part by the electrical connections between the internal row and column conductors corresponding to the external row and column conductors through the memory elements.

2. The computational architecture of claim 1 wherein the interface circuits and the memory elements further configure tile circuits alternatively, as each of a logic element, interconnect element and:
(3) a multibit memory receiving input signals on some of the external conductors for storage of the input signals as stored data and to provide output signals on some of the external conductors at a later time representing stored data, the stored data defined at least in part by the electrical connections between the internal row and column conductors corresponding to the external row and column conductors through the memory elements.

3. The computational architecture of claim 2 wherein the interface circuit and the memory elements further configure the tile circuits alternatively as each of a logic element, interconnect element and:
(4) an associative memory receiving first input signals on some of the external conductors providing an input data pattern to compare with the stored data and providing output signals on some of the external conductors indicating a hamming distance of the input data pattern as compared with the pattern of stored data, the stored data defined at least in part by the electrical connections between the internal row and column conductors corresponding to the external row and column conductors through the memory elements.

4. The computational architecture of claim 3 wherein the interface circuits provide for bidirectional communication of data between a tile circuit and the external conductors.

5. The computational architecture of claim 1 wherein the interface circuits operate in a pass-through mode to map a first set of N external row or column conductors on a 1-1 basis to corresponding N lines of internal row or column conductors and alternatively in a decoder mode to map the first set of N external row or column conductors on a M of N selection basis to one of the corresponding N lines of internal row or column conductors.

6. The computational architecture of claim 5 wherein the internal row and column conductors are organized in pairs of row and column conductors and wherein the interface circuit further includes a switch for selectively connecting a given signal on an external conductor alternatively to only one line of a pair of internal column or row conductors and to both lines of the pair of internal column and row conductors.

7. The computational architecture of claim 1 wherein the external conductors extend from the tile circuits along first and second non-parallel row and column axes and wherein the interconnection elements receive input signals from external row or column conductors on one axis and contemporaneously outputs output signals on external row or column conductors of the other axis.

8. The computational architecture of claim 1 wherein the tile circuits are arranged in rectilinear rows and columns with external row or column conductors extending from four sides of the tile circuit in two perpendicular directions and wherein the external row conductors extending to communicate between tile circuits in the rows interconnect within each tile circuit by internal row conductors and the external column conductors extending to communicate between tile circuits in the external columns interconnect within each tile circuit by internal column.

9. The computational architecture of claim 8 wherein separate interface circuits are associated with internal row conductors and internal column conductors and wherein each separate interface circuit includes a first and second identical portion at either ends of the internal column conductors and at either end of the internal row conductors.

10. The computational architecture of claim 9 wherein the interface circuits are identical for all rows and columns.

11. The computational architecture of claim 9 wherein the interface circuits include sense amplifiers providing a comparison of a received analog voltage against at least one threshold to provide a digital output.

12. The computational architecture of claim 1 wherein the memory elements each provide at least three memory states.

13. The computational architecture of claim 1 wherein each interface circuit is associated with a writable register receiving data defining a programmable configuration of the interface circuit in implementing a configuration of the memory elements.

14. The computational architecture of claim 1 wherein the computational architecture provides architectural input and output circuits conforming to an interface for a random access memory.

15. A computational architecture comprising:
a set of tile circuits having conductors communicating between the tile circuits, each tile circuit providing:
a set of memory elements for storing at least a first and second memory state; and
interface circuits communicating between the conductors and the memory elements to programmably configure the memory elements as either:
(1) a logic element receiving input signals on some of the conductors to provide output signals on some of the conductors being a logical function of the input signals different from the input signals; and
(2) an interconnection element passing input signals on some of the conductors to provide output signals on other of the conductors communicating the input signals to the other of the conductors;
wherein the memory elements are positioned at intersections of logical row lines and column lines and wherein the interface circuits operate in a pass-through mode to map a first set of N conductors on a 1-1 basis to corresponding N lines and in a decoder mode to map the first set of N conductors on a M of N selection basis to one of the corresponding N lines;
wherein the interface circuit further includes a switch for selectively connecting a given signal on a conductor alternatively to only one line of the column line pair and to both lines of a column pair; and
wherein the interface circuit further includes an inverter system for inverting the given signal for one line of the column pair and not for the other line of the column pair.

16. A computational architecture comprising:
a set of tile circuits having conductors communicating between the tile circuits, each tile circuit providing:
a set of memory elements for storing at least a first and second memory state; and
interface circuits communicating between the conductors and the memory elements to programmably configure the memory elements alternatively as each of:
(1) a logic element receiving input signals on some of the conductors to provide output signals on some of the conductors being a logical function of the input signals different from the input signals depending on the first and second memory states of the memory elements; and
(2) an interconnection element passing input signals on some of the conductors to provide output signals routed to at least one of two other of the conductors communicating the input signals to the other of the conductors depending on the first and second memory states of the memory elements;
wherein the memory elements are nonvolatile memory elements providing conductive links whose resistance defines the memory state of the memory elements and wherein the logic elements and interconnection element receives input signals passing through the conductive links of memory elements to define output signals of the logic elements and interconnection elements; and
wherein the nonvolatile memory elements are selected from the group consisting of: phase change memory (PCM), magnetoresistive random access memory (MRAM), spin transfer torque random access memory (STT RAM), resistive random access memory (RRAM), conductive bridge random access memory (CBRAM) and nanoelectromechanical (NEMS) memory.

17. A computational architecture comprising:
a plurality of interconnected tile circuits having external input and output conductors extending from the tile circuit in each of four perpendicular directions, each tile circuit providing:
a plurality of memory elements for storing at least a first and second memory state and positioned between the intersections of internal row and column conductors to provide an electrical connection between given rows and columns of the internal row and column conductors through the memory elements depending on a memory state of the given memory element;
a plurality of interface circuits communicating between the external input and output conductors and the internal row and column conductors, wherein the interface circuits and the memory elements programmably configure the memory elements alternatively as each of:
(1) a multi-bit nonvolatile memory receiving input signals on some of the external conductors for storage of the input signals as stored data and to provide output signals on some of the external conductors at a later time representing stored data, the stored data defined at least in part by the electrical connections between the internal row and column conductors corresponding to the external row and column conductors through the memory elements;
(2) a logical gate array receiving input signals on some of the external row or column conductors to provide output signals on other of the external row or column conductors being a logical function of the input signals different from the input signals, the logical function determined at least in part by the electrical connections between the internal row and column conductors corresponding to the external row and column conductors through the memory elements; or
(3) a routing switch passing input signals on external row or column conductors to provide output signals identical to the input signals on either of at least two other selected external row and column conductors, the selected other of the row and column conductors determined at least in part by the electrical connections between the internal row and column conductors corresponding to the external row and column conductors through the memory elements;
wherein some of the interconnected tiles are configured as multi-bit nonvolatile memory, and some of the tiles are configured as logical gate arrays, and wherein the logical gate arrays and multi-bit nonvolatile memory are interconnected by tiles configured as crossbar switches.

18. The computational architecture of claim 1 wherein the tile circuits are identical.

19. The computational architecture of claim 16 wherein the interface circuits further configure the memory elements as:

(3) a multibit memory storing data in the memory state of the memory elements accessible for reading and writing.

* * * * *